(12) United States Patent
Ebbecke

(10) Patent No.: US 10,586,889 B2
(45) Date of Patent: Mar. 10, 2020

(54) SINGLE PHOTON SOURCE AND METHOD OF CONTROLLED GENERATION OF PHOTONS

(71) Applicant: OSRAM Opto Semiconductors GmbH, Regensburg (DE)

(72) Inventor: Jens Ebbecke, Rohr in Niederbayern (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/347,891

(22) PCT Filed: Jan. 23, 2018

(86) PCT No.: PCT/EP2018/051560
§ 371 (c)(1),
(2) Date: May 7, 2019

(87) PCT Pub. No.: WO2018/141584
PCT Pub. Date: Aug. 9, 2018

(65) Prior Publication Data
US 2019/0341522 A1    Nov. 7, 2019

(30) Foreign Application Priority Data
Jan. 31, 2017  (DE) .................. 10 2017 101 877

(51) Int. Cl.
*H01L 33/06* (2010.01)
*H01L 27/20* (2006.01)
*H01L 33/32* (2010.01)

(52) U.S. Cl.
CPC .............. *H01L 33/06* (2013.01); *H01L 27/20* (2013.01); *H01L 33/32* (2013.01)

(58) Field of Classification Search
None
See application file for complete search history.

(56) References Cited

U.S. PATENT DOCUMENTS

| 8,791,494 B2 | 7/2014 | Jeong et al. |
| 2004/0173816 A1 | 9/2004 | Saxler |

FOREIGN PATENT DOCUMENTS

| GB | 2354368 A | * 3/2001 | ............. B82Y 20/00 |
| GB | 2354368 A | 3/2001 | |

(Continued)

OTHER PUBLICATIONS

Wiele, Christian, et al. "Photon Trains and Lasing: The Periodically Pumped Quantum Dot." Physical Review A, vol. 58, No. 4, 1998, doi:10.1103/physreva.58.r2680. (Year: 1998).*

(Continued)

*Primary Examiner* — J. E. Schoenholtz
(74) *Attorney, Agent, or Firm* — DLA Piper LLP (US)

(57) ABSTRACT

A single photon source includes a semiconductor body and a transducer, wherein the transducer during operation of a single photon source can be coupled into an active zone, disposed between a first and second semiconductor layer of the semiconductor body, the active zone and the transducer are arranged at a same vertical height to a carrier of the single photon source and piezoelectric intermediate layer material so that the intermediate layer is a propagation medium for surface waves generated or excited by the transducer, the intermediate layer is arranged in places between the first semiconductor layer and the active zone and adjoins the active zone, and an electrical insulation between the intermediate layer and the transducer is achieved by the intermediate layer being undoped at least in overlapping regions with the transducer or by an insulating layer being arranged between the transducer and the intermediate layer.

19 Claims, 4 Drawing Sheets

(56) References Cited

FOREIGN PATENT DOCUMENTS

| GB | 2417126 A | 2/2006 |
|---|---|---|
| JP | 2005-189330 A | 7/2005 |
| JP | 2005-317722 A | 11/2005 |

OTHER PUBLICATIONS

Foden, C L, et al., "High Frequency Acousto-electric Single Photon Source." *Physical Review A.* pp. 1-11.20 Apr. 2000 https://www.academia.edu/29560348/High-frequency_acousto-electrie_single-photon_source.

Gell, J. R., et al., "Modulation of single quantum dot energy levels by a surface-acoustic-wave." *Applied Physics Letters* 93(081115):1-3. Aug. 28, 2008. http://biophys.w3.kanazawa-u.ac.jp/References/Acoustics/Qdot-SAW-APL-2008.pdf.

Kuhlmann, Andreas V., "Transform-limited single photons from a single quantum dot." *Nature Communications* 6(8204):1-6. Sep. 8, 2015 https://www.nature.com/articles/ncomms9204.

Sherer, Kyle, "World's first commercial source of individual photons." *New Atlas*, Mar. 2, 2008. https://newatlas.com/quantum-computing-single-particle/8907/.

Shields, Andrew J., "Semiconductor quantum light sources." *Nature Photonics* 1:215-223. Apr. 2007. https://courses.physics.illinois.edu/phys513/sp2016/reading/week1/SemicondSourcesShieldsReviewNatPhot07.pdf.

\* cited by examiner

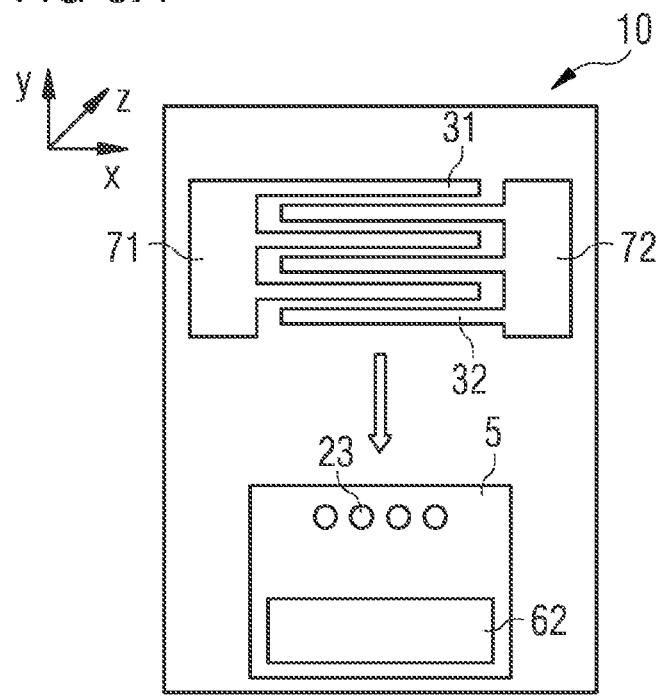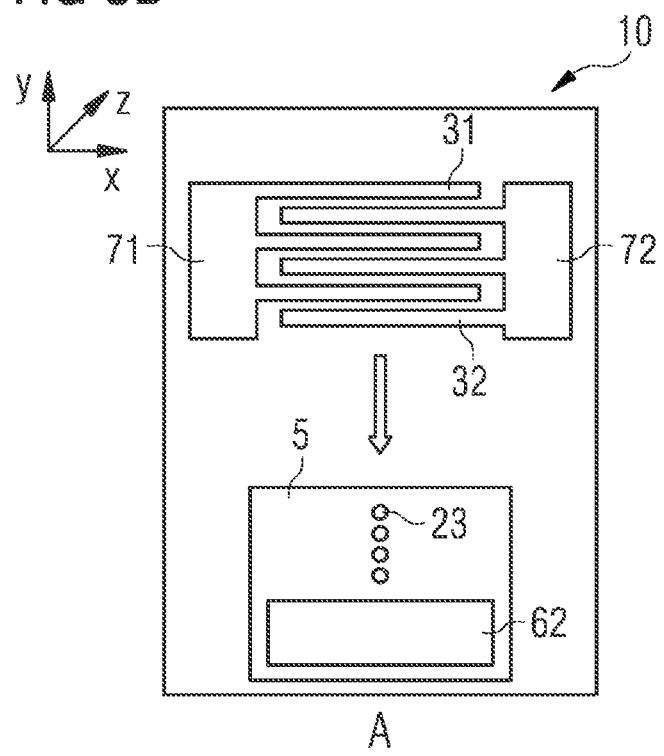

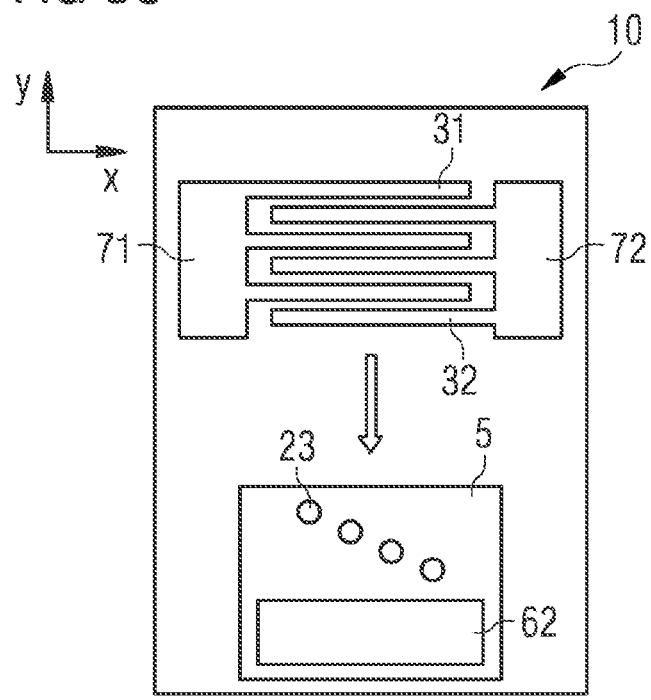
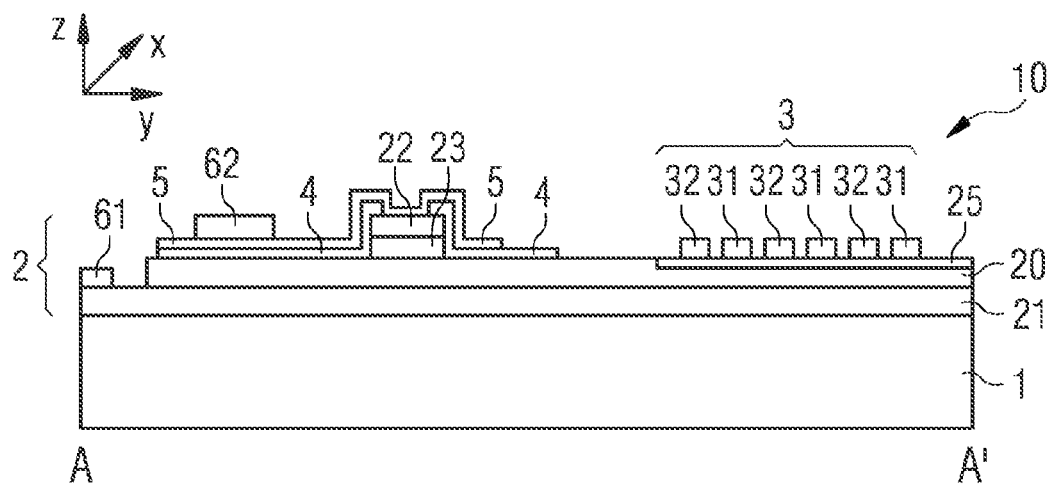

SINGLE PHOTON SOURCE AND METHOD OF CONTROLLED GENERATION OF PHOTONS

TECHNICAL FIELD

This disclosure relates to a single photon source and a method for the controlled generation of photons.

BACKGROUND

Single photon sources are characterized by the fact that they emit only individual photons in a controllable way, whereby the simultaneous emission of several photons is suppressed. It is technologically very challenging to reproducibly realize electrically controllable single photon sources that exhibit such a pronounced photon anti-bunching, in which several individually emitted photons can be clearly separated from each other. For capacitive reasons and with regard to the emission rate, the single photon sources can only usually be used in the low frequency range between a few kHz and a few MHz. In addition, room temperature operation is not possible of most conventional single photon sources due to insufficient photon anti-bunching. These are some of the main problems that have limited the commercial use of single photon sources so far.

It could therefore be helpful to provide an efficient and widely applicable single photon source and a reliable method for the controlled generation of photons, in particular of individual photons.

SUMMARY

I provide a single photon source including a semiconductor body and a transducer, wherein the semiconductor body has an active zone that generates individual photons, the active zone containing a piezoelectric semiconductor material, the transducer is configured to generate surface waves, the semiconductor body and the transducer are arranged with respect to one another such that the surface waves generated by the transducer during operation of the single photon source can be coupled into the active zone, the active zone is disposed between a first semiconductor layer and a second semiconductor layer of the semiconductor body, the active zone and the transducer are arranged at a same vertical height to a carrier of the single photon source and on an intermediate layer made of a piezoelectric material so that the intermediate layer is a propagation medium for the surface waves generated or excited by the transducer, the intermediate layer is arranged in places between the first semiconductor layer and the active zone and adjoins the active zone, and an electrical insulation between the intermediate layer and the transducer is achieved by the intermediate layer being undoped at least in overlapping regions with the transducer or by an insulating layer being arranged between the transducer and the intermediate layer.

I also provide a method of generating a single photon source that includes a semiconductor body and a transducer, wherein the semiconductor body has a first semiconductor layer, a second semiconductor layer and an active zone that generates individual photons, the active zone containing a piezoelectric semiconductor material, the transducer is configured to generate surface waves, and the semiconductor body and the transducer are arranged with respect to one another such that the surface waves generated by the transducer during operation of the single photon source can be coupled into the active zone, the method including applying the semiconductor body onto a substrate, structuring the semiconductor body such that the second semiconductor layer and the active layer are removed in regions as a result of which the active layer has at least one island-like portion formed as an active zone assigned to an island-like subregion of the semiconductor body on the first semiconductor layer, and forming the transducer on a surface of the semiconductor body exposed by structuring, the transducer being laterally spaced from the active zone.

I further provide a method of generating photons with the single photon source comprising a semiconductor body and a transducer, wherein the semiconductor body has an active zone that generates individual photons, the active zone containing a piezoelectric semiconductor material, the transducer is configured to generate surface waves, the semiconductor body and the transducer are arranged with respect to one another such that the surface waves generated by the transducer during operation of the single photon source can be coupled into the active zone, the active zone is disposed between a first semiconductor layer and a second semiconductor layer of the semiconductor body, the active zone and the transducer are arranged at a same vertical height to a carrier of the single photon source and on an intermediate layer made of a piezoelectric material so that the intermediate layer is a propagation medium for the surface waves generated or excited by the transducer, the intermediate layer is arranged in places between the first semiconductor layer and the active zone and adjoins the active zone, and an electrical insulation between the intermediate layer and the transducer is achieved by the intermediate layer being undoped at least in overlapping regions with the transducer or by an insulating layer being arranged between the transducer and the intermediate layer, including providing a semiconductor body having an active zone made of a piezoelectric semiconductor material, wherein the active zone is electrically biased, and an external electrical voltage ($V_O$) is selected such that a band deflection but no recombination of charge carriers takes place in the active zone, generating surface waves by a transducer, the semiconductor body and the transducer being arranged with respect to one another such that the surface waves generated by the transducer are coupled into the active zone as a result of which a piezoelectric voltage ($V_W$) is generated in the active zone, and exciting a recombination of charge carriers in the active zone by superpositioning the external electric voltage ($V_O$) and the piezoelectric voltage ($V_W$) to generate the photons.

I still further provide a single photon source including a semiconductor body and a transducer, wherein the semiconductor body has an active zone that generates individual photons, the active zone containing a piezoelectric semiconductor material, the transducer is configured to generate surface waves, the semiconductor body and the transducer are arranged with respect to one another such that the surface waves generated by the transducer during operation of the single photon source can be coupled into the active zone, and the single photon source has one of:

i. the active zone is assigned to an island-like subregion of the semiconductor body; or ii. the semiconductor body includes a first semiconductor layer and a second semiconductor layer, the active zone is disposed between the first semiconductor layer and the second semiconductor layer, the first semiconductor layer is contiguous, and the active zone and the second semiconductor layer each include a plurality of laterally spaced apart portions forming island-like subregions of the semiconductor body.

BRIEF DESCRIPTION OF THE DRAWINGS

FIGS. 3A, 3B, 3C and 4 show further examples of a single photon source in schematic sectional views.

LIST OF REFERENCE SIGNS

Figure 1A:
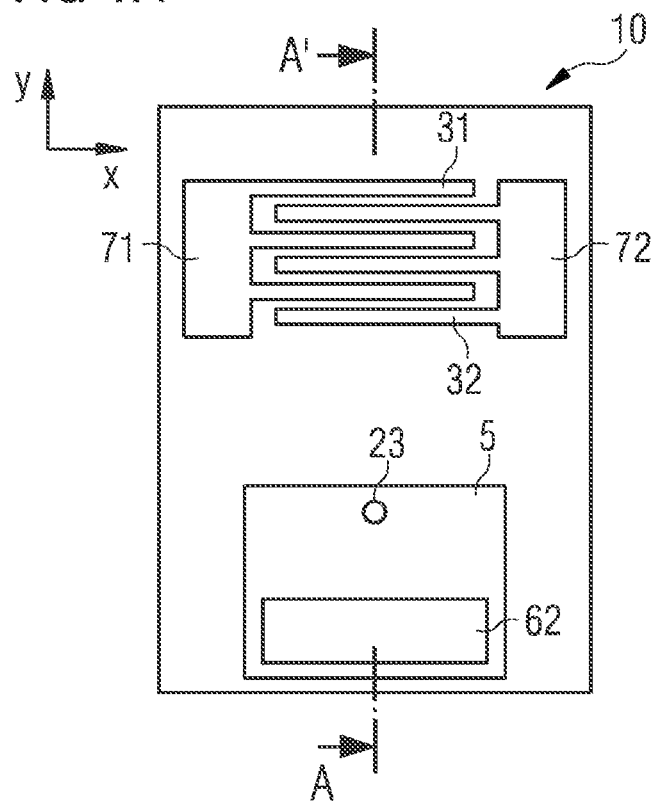
FIGS. 1A and 1B show a single photon source in schematic sectional views.

10 Single photon source
1 Carrier/substrate
2 Semiconductor body
20 Intermediate layer
21 First semiconductor layer
22 Second semiconductor layer
23 Active zone/active layer
25 Insulating layer
3 Transducer
31 First structure of the transducer
32 Second structure of the transducer
4 Passivation layer
5 Contact layer
61 First contact point of the semiconductor body
62 Second contact point of the semiconductor body
71 First connection point of the transducer
72 Second connection point of the transducer
$E_L$ conduction band
$E_V$ valence band
$E_{Fp}$ p-side Fermi level
$E_{Fn}$ n-side Fermi level
$V_O$ bias voltage
$V_W$ piezoelectric voltage
γ photon

DETAILED DESCRIPTION

The single photon source may comprise a semiconductor body and a transducer. The semiconductor body has an active zone configured to generate individual photons. Expediently, the active zone contains a piezoelectric semiconductor material. In particular, the semiconductor body comprises an LED structure having the active zone. The transducer is configured to generate surface waves. In particular, surface acoustic waves are excited by the transducer that can be coupled into the semiconductor body. The semiconductor body and the transducer are preferably arranged such that during operation of the single photon source, the surface waves generated by the transducer can be coupled into the active zone.

A surface acoustic wave, in piezoelectric materials is associated with a periodic change of electrical potential. If the semiconductor body comprising the LED structure is electrically biased such that just no recombination of charge carriers takes place, due to the periodic change of potential, the surface wave lowers or increases a continuously periodically varying band deflection in the LED structure. In a first half of the period of the surface wave, a resulting voltage can be increased to such an extent that the charge carriers can overcome the potential barriers and fill a quantum well of the active zone, while in a second half of the period, the resulting voltage is lowered by the surface wave so that further occupation of the quantum well by an electron-hole pair is prevented. Thus, an individual photon per surface wave period is generated in a quantum well in a controllable manner. The active zone is formed in terms of its geometric size and its operating temperature such that exactly one electron and one hole populate the quantum well at least locally per surface wave period, as a result of which a single photon source can be realized. In particular, the geometric size of the active zone is chosen such that due to quantization and Coulomb repulsion, an energy splitting in the quantum well is greater than the thermal energy, which depends on the operating temperature, so that exactly one electron and one hole occupy a quantum well of the active zone per surface wave period.

The semiconductor body may comprise a first semiconductor layer and a second semiconductor layer, wherein the active zone is arranged in the vertical direction between the first semiconductor layer and the second semiconductor layer. The first semiconductor layer and the second semiconductor layer can be n-conductive and p-conductive, respectively, or vice versa. In particular, the n-conducting semiconductor layer is arranged vertically between a carrier of the single photon source and the active zone. In particular, the active zone and the transducer are arranged on the same first semiconductor layer and are spaced apart in the lateral direction. For example, the active zone and the transducer are located on the same side of the first semiconductor layer. The active zone and the second semiconductor layer can each have a plurality of laterally spaced and thus island-likely formed portions, wherein an island-like portion of the active zone and an island-like portion of the second semiconductor layer form an island-like subregion of the semiconductor body. It is also possible for the semiconductor body to have only one island-like subregion containing the entire active zone and the entire second semiconductor layer.

A vertical direction is understood to mean a direction transverse, in particular perpendicular to a main extension plane of the semiconductor body such as of the first semiconductor layer. For example, the vertical direction is parallel to a growth direction of the semiconductor body. A lateral direction is generally understood to mean a direction running along, in particular parallel to, the main extension plane of the semiconductor body or the first semiconductor layer. The vertical direction and the lateral direction are transverse or essentially perpendicular to each other.

The semiconductor body may be based on a III-V or II-VI compound semiconductor material. The semiconductor body can have semiconductor layers exclusively. In particular, the semiconductor body is epitaxially applied or arranged on a substrate. The substrate is, for example, a growth substrate for instance made of silicon or a sapphire substrate. In particular, the substrate serves as a carrier for the single photon source. The active zone based on InGaN is particularly preferred. InGaN is an excellent piezoelectric material and is particularly suitable for emitting electromagnetic radiation when the single photon source is in operation. The first and second semiconductor layers can each be based on GaN, wherein the first and second semiconductor layers can be n-conductive and p-conductive, respectively. I found that InGaN-components show Coulomb blockade effects even up to room temperatures so that using InGaN, a single photon source can be realized and operated at liquid nitrogen temperatures or even at room temperatures.

The single photon source may have a carrier. The carrier can be the substrate or different from the substrate. In particular, the active zone and the transducer are arranged at the same vertical height to the carrier. If surface acoustic waves are generated or excited by the transducer, they can be easily coupled into the active zone. For example, the active zone and the transducer are arranged on a common semiconductor layer, wherein the common semiconductor layer has a solid and at least partially exposed surface. The common semiconductor layer can thus serve as a propagation medium for the surface acoustic waves generated by the transducer.

The semiconductor body may have an intermediate layer directly or indirectly adjacent to both the active zone and the transducer. The intermediate layer can be the common semiconductor layer mentioned above, arranged for instance in places between the first semiconductor layer and the active zone. The intermediate layer and/or the common semiconductor layer are preferably made or consist of a piezoelectric material. The intermediate layer and/or the common semiconductor layer may be based on a III-V compound semiconductor material such as GaN.

The intermediate layer can have portions that in a plan view are exposed and thus free from overlaps with the active zone and/or with the second semiconductor layer. In particular, the intermediate layer is undoped or at least undoped in the overlapping regions with the transducer. However, it is also possible that the intermediate layer is essentially undoped or, at least in the overlapping regions with the transducer, is doped so low that an electrical connection between the transducer and the active zone is prevented, even if the transducer and the active zone are arranged directly on the intermediate layer. The intermediate layer can thus serve as a propagation medium for the surface waves generated or excited by the transducer. A layer is essentially undoped or low-doped if this layer contains in particular only traces of dopants or has a doping concentration of for instance at most $10^{13}$ cm$^{-3}$, $10^{10}$ cm$^{-3}$ or at most $10^5$ cm$^{-3}$ or at most $10^3$ cm$^{-3}$.

The transducer may be arranged on the semiconductor body and electrically isolated from it. The electrical isolation can be achieved by the intermediate layer. Alternatively or in addition, it is possible that an insulating layer is arranged between the transducer and the semiconductor body. The insulating layer may comprise or consist of a piezoelectric material.

The transducer may be an interdigital transducer (IDT) comprising finger-like structures, where the finger-like structures interlock without touching each other. The transducer can have a first connection point and a second connection point via which the finger-like structures can electrically connect to an external voltage source. If an external electrical voltage, in particular an AC voltage, is applied to the transducer, vibrations can be generated. In other words, the transducer can convert electrical energy into mechanical energy, for example, in the form of surface waves, in particular in the form of surface acoustic waves, whereby the surface waves are coupled into the active zone via the intermediate layer. The frequency at which the surface waves are generated can be adjusted in a simple manner by the transducer and the AC voltage applied. With regard to the emission rate, this makes it possible for the single photon source to be applicable not only in the lower frequency range between a few kHz and a few MHz but also in the higher frequency range, for example, in the GHz range.

The active zone may comprise a quantum well layer. A quantum well defined by a quantum well layer and its associated barrier layers may be a quantum film, a quantum wire, a quantum trough, a quantum dot, or a combination of these structures. The quantum well layer can be formed contiguously and assigned to a single radiation-active subregion of the semiconductor body. However, it is also possible that the quantum well layer has a plurality of spatially spaced portions, each of which is assigned to one of the laterally spaced subregions of the semiconductor body.

The entire active zone may be assigned to an island-like subregion formed in particular as a quantum dot of the semiconductor body. The island-like subregion preferentially has only one single quantum well that from time to time during operation of the single photon source is populated by a single pair of charge carriers. The charge carrier pair is usually an electron-hole pair that can recombine in the quantum well under emission of radiation, emitting an individual photon. It is possible that the active zone has a plurality of spatially separated portions, each of which is assigned to one of the island-like subregions of the semiconductor body.

The single photon source may have a first contact point and a second contact point to electrically contact the semiconductor body and thus the active zone. In particular, the contact points are assigned to a first current circuit, for instance to a DC circuit, during operation of the single photon source, while the connection points of the transducer are assigned to a second current circuit, for instance to an AC circuit, different from the first current circuit. In other words, the transducer and the semiconductor body of the single photon source are assigned to two different current circuits.

In a method of producing a single photon source described above, the semiconductor body comprising an active layer, a first semiconductor layer and a second semiconductor layer, is applied to a substrate by a coating process, in particular layer by layer. The coating process may be an epitaxial process, wherein the substrate is a growth substrate. The semiconductor body is then structured such that the second semiconductor layer and the active layer are removed in places, as a result of which the active layer and/or the second semiconductor layer each have one island-like portion or more island-like portions on the first semiconductor layer. The remaining portions of the active layer and the second semiconductor layer form one island-like subregion or several island-like subregions of the semiconductor body on the common first semiconductor layer. Thus, the structured active layer forms the active zone of the single photon source to be produced.

During structuring of the semiconductor body, in particular material of the second semiconductor layer and/or the active layer is removed. A chemical process such as an etching process can be used for this purpose. The transducer is formed on a surface of the semiconductor body exposed by the structuring, wherein the transducer is laterally spaced from the active zone. The exposed surface of the semiconductor body is located between the substrate and the active zone and may be the surface of a layer made of a piezoelectric material. For example, the exposed surface is a surface of an almost undoped or of undoped semiconductor layer, for instance of a GaN layer.

Surrounding regions of at least one island-like subregion or surrounding regions of the island-like subregions of the semiconductor body are removed along the vertical direction through the second semiconductor layer and the active layer to a slightly doped or undoped intermediate layer of the semiconductor body. In a subsequent method step, the transducer can be processed on the exposed surface of the intermediate layer.

A passivation layer may be formed on at least one island-like subregion or on the island-like subregions of the semiconductor body. In particular, an electrically insulating material is applied over a large area to the structured semiconductor body such that the at least one island-like subregion or the island-like subregions of the semiconductor body is/are completely covered by the passivation layer in a plan view. In particular, the transducer is free from the passivation layer or free from any general covering layer. The passivation layer is partially opened to expose the second semiconductor layer, whereupon a radiation-permeable contact layer is applied onto the second semiconductor layer. The radiation-permeable contact layer can be formed from an electrically conductive oxide, for instance from indium tin oxide (ITO).

The method described above is particularly suitable for the production of a single photon source described here. Features described in connection with the single photon source can therefore also be used for the method and vice versa.

In a method for a controlled generation of photons, in particular of individual photons, a semiconductor body comprising an active zone made of a piezoelectric semiconductor material may be provided. The active zone may be electrically biased, wherein an external electrical voltage is selected such that a band deflection but no recombination of charge carriers takes place in the active zone. Surface waves, in particular surface acoustic waves are generated by a transducer, wherein the semiconductor body and the transducer are arranged relative to one another such that the surface waves generated by the transducer are coupled into the active zone, as a result of which a piezoelectric voltage is generated in the active zone. By superposition of the external electrical voltage and the piezoelectric voltage, a recombination of charge carriers in the active zone is excited for the controlled generation of photons, in particular of individual photons.

Usually, the external electrical voltage is kept constant. Due to the applied external electrical voltage, a band deflection takes place in the semiconductor body so that the corresponding quasi Fermi levels in the active zone are no longer the same. However, the external electrical voltage is set so low that just no recombination of charge carriers takes place in the individual quantum well of the active zone. A propagating surface wave on or in a layer of piezoelectric material is associated with significant piezoelectric fields that periodically cause additional band deflection in the semiconductor body. This results in generation of a piezoelectric voltage which is a voltage varying with time, whose value changes according to the course of the period of the coupled surface wave. Overall, this leads to a periodically changing resulting voltage composed of the external electrical voltage and the piezoelectric voltage.

During the first half of the period of the surface wave, the piezoelectric voltage can have a positive value that increases the resulting voltage and thus leads to an additional convergence to the so-called "flat band," in which charge carriers can enter the quantum well of the active zone. During the second half of the period of the surface wave in which the piezoelectric voltage has a negative value, the resulting voltage is lowered, thereby suppressing further occupation of the quantum well by charge carriers. If the active zone is formed with regard to its geometrical size and with regard to the operating temperature such that it ends up with the formation of a quantum dot or of several spatially spaced quantum dots, due to the quantization and the Coulomb repulsion, only a single hole and a single electron can populate the quantum well of the associated quantum dot. Finally, the electron-hole pair recombination can lead to emission of an individual photon. The frequency of recombination of charge carriers thus depends, among other things, directly on the frequency of the surface wave and can therefore be adjusted by the frequency of the electrical voltage applied to the transducer.

In this sense, a periodically pumped and deterministic single photon source can be realized. The recombination rate of the single photon source or the frequency of generation of the single photon can thus be adjusted in a simple manner. The frequency of generation of the individual photons can be in the low-frequency range, for example, in the kHz or MHz range, or in the high-frequency range, for example, in the GHz range.

The frequency of the recombination of charge carriers may be adjusted by the frequency of the electrical voltage applied to the transducer. Alternatively or additionally, it is possible that the active zone contains a plurality of active island-like portions having different lateral distances to the transducer so that the surface wave generated by the transducer encounters the active island-like portions at different times, as a result of which the frequency of the occurrence of the recombination of charge carriers in the active zone is further adjustable by the positions of the island-like portions of the active zone relative to the transducer.

Further advantages, preferred configurations and further developments of the method as well as of the single photon source will become apparent from the examples explained below in connection with the drawings.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

Figure 1B:
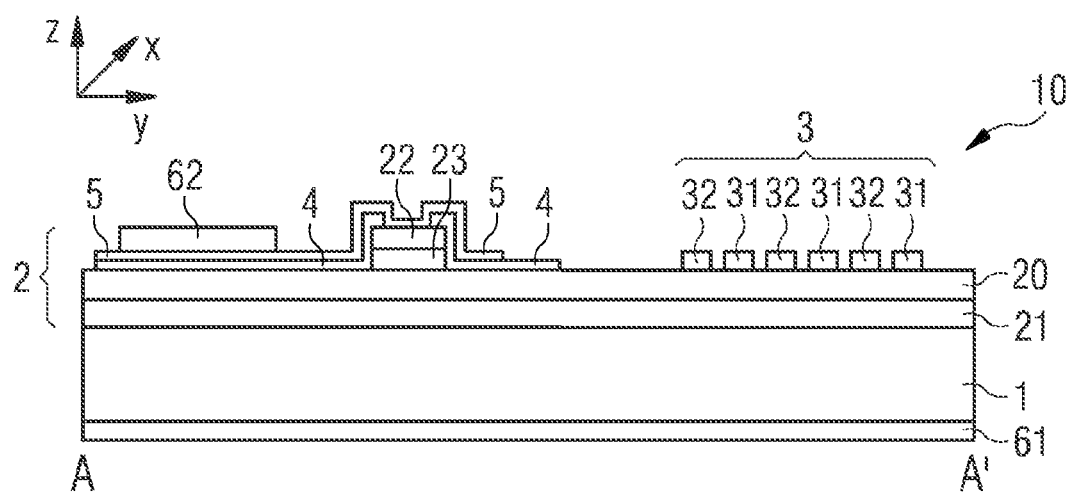

In FIG. 1A, an example of a single photon source 10 is shown schematically in a plan view on the xy plane, where x denotes a lateral direction, e.g. a lateral transverse direction, and y denotes a further lateral direction, e.g. a lateral longitudinal direction. In FIG. 1B, in sectional view in the yz plane, where z denotes a vertical direction, the single photon source 10 is schematically shown along the AA' dashed line shown in FIG. 1A.

The single photon source 10 has a semiconductor body 2 on a carrier 1. Carrier 1 can be a growth substrate on which the semiconductor body 2 is epitaxially deposited. The semiconductor body 2 has a first semiconductor layer 21, a second semiconductor layer 22 and an active zone 23 located there between. For example, the first semiconductor layer is 21 n-conductive and the second semiconductor layer is 22 p-conductive, or vice versa. The semiconductor body 2 also contains an intermediate layer 20 arranged between the carrier 1 and the active zone 23. The intermediate layer 20 can be a low-doped, essentially undoped or an undoped sublayer of the first semiconductor layer 21 facing the active zone 23. The intermediate layer 20 can be adjacent to the active zone 23. In particular, the intermediate layer 20 and the first semiconductor layer 21 may be based on the same semiconductor material, wherein the first semiconductor layer 21 has a higher concentration of dopants than the intermediate layer 20.

The semiconductor body 2 is preferably based on a piezoelectric material. For example, the semiconductor body comprises a III-V or II-VI compound semiconductor material. For example, the first and second semiconductor layers 21 and 22 as well as the intermediate layer 20 are made of GaN. The active zone 23 comprises InGaN. Together with the semiconductor layers 21 and 22 as well as the active zone 23, the semiconductor body 2 has an LED structure that can emit 10 photons, especially individual photons, during operation of the single photon source.

As shown in FIGS. 1A and 1B, the second semiconductor layer 22 and the active zone 23 form an island-like subregion of the semiconductor body 2 on the intermediate layer 20 and the first semiconductor layer 21. The island-like subregion projects vertically over a surface of the intermediate layer 20 facing the active zone 23. This subregion may have a vertical height of 50 nm to 500 nm, for instance 100 nm to 200 nm. In a plan view of the carrier 1, the second semiconductor layer 22 and the active zone 23 cover the carrier 1 only regionally, for example, not more than 10%, 5% or not more than 3% or 1% of a surface of the carrier 1. The intermediate layer 20 and/or the first semiconductor layer 21 can cover the carrier 1 completely or almost completely, for instance at least 70%, 80%, 90% or at least 95% of the surface of the carrier 1. For example, in a plan view, the intermediate layer 20 and the first semiconductor layer 21 are congruent.

In lateral directions, the active zone 23 and the second semiconductor layer 22 are surrounded, especially completely enclosed by a passivation layer 4. The passivation layer 4 can be applied to the semiconductor body 2 by a coating process, for example, by atomic layer deposition (ALD), in particular after the semiconductor body 2 has been structured to form the island-like subregion. Using atomic layer deposition, vertical edges of the subregion can already be electrically insulated by a particularly thin passivation layer 4. The passivation layer 4, for example, comprises Al2O3. A surface of the second semiconductor layer 22 facing away from the active zone 23 is not or only partially covered by the passivation layer 4. In other words, in a plan view, the passivation layer 4 has an opening in which the second semiconductor layer 22 is exposed. The passivation layer 4 can first be applied over the entire surface of the subregion, wherein the second semiconductor layer 22 is completely covered. In a subsequent method step, the passivation layer 4 can be removed in places to expose the second semiconductor layer 22.

A contact layer 5, that is for instance radiation-permeable, is formed on the passivation layer 4. The contact layer 5 extends through the opening of the passivation layer 4 to electrically contact the second semiconductor layer 22. Due to the passivation layer 4, the contact layer 5 does not directly adjoin the intermediate layer 20 or the first semiconductor layer 21, as a result of which outside the active zone 23, the contact layer 5 is electrically isolated from the intermediate layer 20 and from the first semiconductor layer 21. The contact layer 5 can electrically connect to an external voltage source via a contact point 62 which is arranged in the form of a contact pad on contact layer 5. The contact point 62, for example, is an Au-pad.

To electrically contact the semiconductor body 2, the single photon source 10 has a further contact point 61. The LED structure of semiconductor body 2 can be electrically contacted externally via the first contact point 61 and the second contact point 62. In FIG. 1B, the first contact point 61 is located on the rear side of the carrier 1 facing away from the semiconductor body 2. In this example, the carrier 1 is preferably electrically conductive. For example, the carrier 1 is a silicon substrate. In variation, the carrier 1 may have an electrically insulating substrate and through-vias, wherein the through-vias extend in the vertical direction from the contact point 61 throughout the substrate to the first semiconductor layer 21.

The single photon source 10 has a transducer 3. The transducer 3 and the semiconductor body 2 are arranged on a common carrier 1. The transducer 3 is especially formed to generate surface waves, for instance, surface acoustic waves. The semiconductor body 2 and the transducer 3 are arranged to each other such that the surface waves generated by the transducer 3 during operation of the single photon source 10 can be coupled into the active zone 23. According to FIG. 1B, the transducer 3 is arranged on the intermediate layer 20, wherein the intermediate layer 20 can serve as a propagation medium for the surface waves. The surface waves generated or excited by the transducer 3 can be guided into the active zone 23 via the intermediate layer 20.

The intermediate layer 20 preferably consists of or contains a piezoelectric material. For example, the intermediate layer 20 is a GaN layer. In particular, the intermediate layer 20 is electrically isolated from the transducer 3. The electrical insulation between the intermediate layer 20 and the transducer 3 can also be achieved when the intermediate layer 20 is formed as a semiconductor layer which is low-doped or essentially undoped at least in the overlapping area with the transducer 3. In this example, the transducer 3 can be arranged directly on the intermediate layer 20. Alternatively, it is possible that an insulating layer 25 is arranged between the transducer 3 and the intermediate layer 20 (see FIG. 4).

The transducer 3 has a first connection point 71 and a second connection point 72, wherein the transducer 3 can electrically connect to an external voltage source, for example, to a high-frequency AC voltage source via the connection points 71 and 72. In a plan view, the connection points 71 and 72 are arranged on the intermediate layer 20 and on the first semiconductor layer 21. During operation of the single photon source 10, the semiconductor body 2 and the contact points 61 and 62 are associated to a first current circuit, in particular to a DC circuit, while the transducer 3 comprising the connection points 71 and 72 is associated to a second current circuit different from the first current circuit, for instance to an AC circuit.

The transducer 3 is preferably an Interdigital Transducer (IDT) comprising a plurality of finger-like structures 31 and 32 that interlock without touching each other. The finger-like structures 31 and 32 can be made of metal.

The frequency at which the surface waves are generated depends, inter alia, on the geometry of the transducer 3 and/or the frequency of the applied voltage. The surface waves are generated or excited by applying a high-frequency AC voltage to the transducer 3. The first finger-like structures 31 on one side connect to each other by a connecting track formed for instance as the first connection point 71 and thus are at the same potential. The second finger-like structures 32 on the other side connect to each other by a connecting track formed for instance as a second connection point 72. Due to the alternating voltage, excitation of the mechanical or acoustic surface wave arises as a result of the reversed piezoelectric effect, in which the time-varying electric field between the finger-like structures 31 and 32 generates a periodically changing tension on the piezoelectric intermediate layer 20, wherein the time-varying tension propagates as surface acoustic wave towards the active zone 23.

Figure 2A:
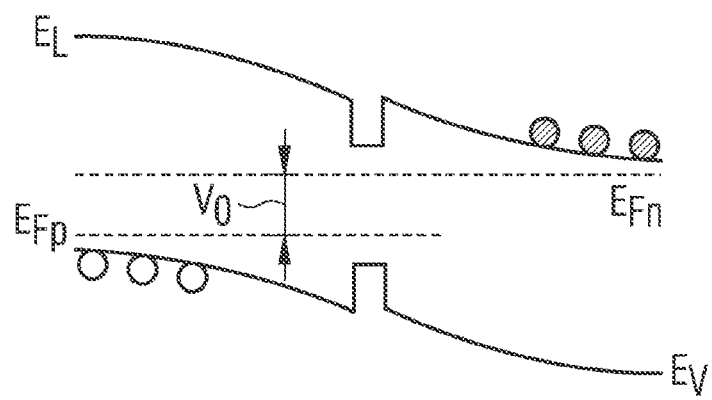
FIGS. 2A, 2B and 2C show schematic diagrams explaining the operating principle of the single photon source.
Figure 2B:
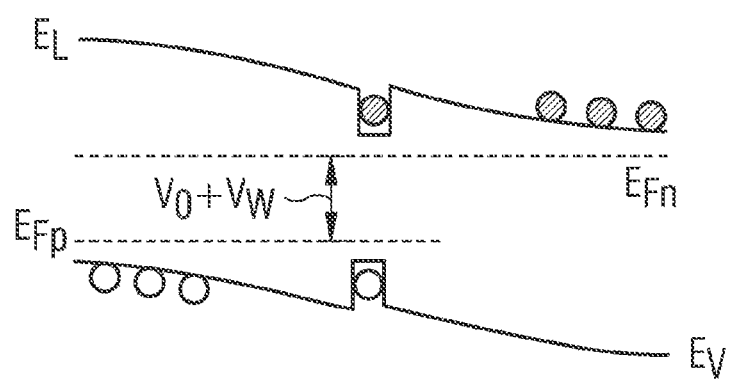
Figure 2C:
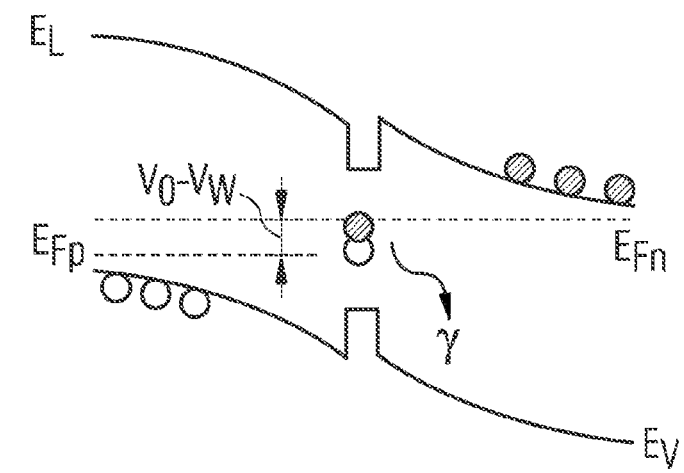

FIGS. 2A, 2B and 2C explain the operating principle of the single photon source 10.

According to FIG. 2A, the active zone 23, which in particular has a pn-junction zone comprising a quantum well, is electrically biased with a bias voltage $V_O$. The voltage $V_O$ is preferably a DC voltage and kept for instance constant or essentially constant. The stress $V_O$ causes a band deflection in the semiconductor body 2 so that the p-side Fermi level $E_{F_p}$ and the n-side Fermi level $E_{F_n}$ are no longer the same. However, the voltage $V_O$ is selected such that the conduction band $E_L$ and the valence band $E_V$ at the quantum well each have such a steep course that the charge carriers cannot populate the quantum well due to the potential barrier. In other words, voltage $V_O$ is chosen such that although a band deflection takes place in the semiconductor body 2, a recombination of charge carriers in the individual quantum well of the active zone 23 is only just prevented. If the semiconductor body 2 is based on GaN and the active zone 23 comprises InGaN, the voltage $V_O$ can be approx. 2.5 V.

A propagating surface wave on or in a layer of piezoelectric material is usually accompanied with significant piezoelectric fields that periodically lead to additional band deflection in the semiconductor body 2, especially in the active zone 3. When the surface wave enters the active zone 23, a piezoelectric voltage $V_W$ having a periodically changing amplitude is induced in the active zone 23. Due to the superposition of the externally applied voltage $V_O$ and the piezoelectric voltage $V_W$, this leads to a periodically changing resulting voltage composed of the voltage $V_O$ and the piezoelectric voltage $V_W$. The amount of the resulting voltage varies between $V_O+V_W$ and $V_O-V_W$ within a period of the surface wave.

During the first half of the surface wave period, the resulting voltage rises and compared to the voltage $V_O$, can be increased by the amount of the piezoelectric voltage $V_W$ (see FIG. 2B), as a result of which the conduction band and the valence band in the associated quantum well become flatter due to the additional band deflection so that charge carriers can arrive at the quantum well.

During the second half of the surface wave period, the resulting voltage decreases and compared to the voltage $V_O$, can be reduced by the amount of the piezoelectric voltage $V_W$ (see FIG. 2C), as a result of which the conduction band and the valence band in the associated quantum well become steeper again due to the additional band deflection so that a further population of the quantum well for instance by further electron-hole pairs is suppressed.

By adjusting the geometric size of the active zone 3, particularly with regard to the operating temperature, a single electron-hole pair can populate the quantum well during a period of the surface wave, which under recombination leads to emission of an individual photon y. In this sense, the active zone 3 has a quantum dot at which an individual photon is emitted. In other words, formation of the quantum dot can suppress the simultaneous emission of two photons at that one single quantum dot. In this sense, the island-like subregion of the semiconductor body 2 comprising the active zone 23 and the second semiconductor layer 22 shown in FIGS. 1A and 1B can be regarded as the radiation-active quantum dot of the single photon source 10.

The time interval between two events in which an individual photon is generated depends inter alia directly on the frequency of the surface wave. This in turn depends on the frequency of the electrical voltage applied to the transducer 3 and/or depends on the structure of the transducer 3 and can therefore be adjusted in a simple manner. The frequency with regard to generation of photons, in particular of individual photons, can be simplified, for example, in the low-frequency kHz or MHz range or in the high-frequency GHz range.

The examples of a single photon source 10 shown in FIGS. 3A, 3B and 3C essentially correspond to the example shown in FIG. 1A. According to FIG. 1A, the semiconductor body 2 has only one single island-like subregion comprising the contiguous active zone 23 and the contiguous second semiconductor layer 22. In contrast, in FIGS. 3A, 3B and 3C, the semiconductor body 2 has a plurality of laterally-spaced island-like subregions, each of which is radiation-active and configured to generate one single photon. Accordingly, the second semiconductor layer 22 and the active zone 23 each comprise a plurality of spatially spaced portions, wherein each island-like subregion of the semiconductor body 2 comprises an island-like portion of the second semiconductor layer 22 and an island-like portion of the active zone 23. The island-like subregions of the semiconductor body 2 are arranged on a common contiguous first semiconductor layer 21 of the semiconductor body 2.

The recombination of charge carriers can occur in any of the island-like subregions of the semiconductor body 2. The frequency with regard to generation of individual photons can thus be additionally adjusted by the relative arrangement of the island-like subregions of the semiconductor body 2 to the transducer 3 since the surface wave generated by the transducer 3 will encounter the various radiation-active subregions at different times. The arrow shown in FIGS. 3A to 3C indicates the propagation direction of the surface waves.

In FIG. 3A, the island-like subregions of the semiconductor body 2 each comprising an island-like portion of active zone 23 are arranged in a row along the lateral transverse direction x. Individual photons can be generated simultaneously or almost simultaneously in the individual portions of the active zone. In FIG. 3B, the island-like subregions of the semiconductor body 2 are arranged in a row along the lateral longitudinal direction y. The example shown in FIG. 3C is a combination of the exemplary embodiments shown in FIGS. 3A and 3B, wherein the row of island-like subregions of the semiconductor body 2 is arranged along a lateral diagonal direction. According to FIGS. 3B and 3C, individual photons can be generated in the portions of the active zone 23 one after the other, leading to a further increase of the frequency of generation of the individual photons.

The example of a single photon source 10 shown in FIG. 4 essentially corresponds to the example shown in FIG. 1B. In contrast to this, the single photon source 10 has an insulating layer 25 arranged between the transducer 3 and the semiconductor body 2. The insulating layer 25 is made of an electrically insulating material that may have piezoelectric properties. The electrically insulating material can be an undoped or low-doped semiconductor material. By the insulating layer 25, the transducer 3 is electrically isolated from the semiconductor body 2.

According to FIG. 4, the first contact point 61 of semiconductor body 2 is not located on the rear side but on a partially exposed surface of the first semiconductor layer 21, wherein the partially exposed surface faces the active zone 23. The partial exposure of the first semiconductor layer 21 can be carried out by an additional etching step in which the intermediate layer 20 is removed in places to expose the first semiconductor layer 21. In a plan view, both the first contact point 61 and the second contact point 62 of semiconductor body 2 are arranged laterally to the active zone 23 and therefore do not overlap with the active zone 23.

The application of surface waves for the controlled generation of single photons may enable the mass production of single photon sources, in particular of InGaN single photon sources, wherein the emission rate of the single photon sources can be adjusted in a wide frequency range between several kHz and several GHz in a simplified manner.

This application claims priority of DE 10 2017 101 877.8, the subject matter of which is incorporated herein by reference.

My sources and methods are not restricted to configurations by the description made with reference to examples. This disclosure rather comprises any novel feature and any combination of features, including in particular any combination of features in the appended claims, even if the feature or combination is not itself explicitly indicated in the claims or examples.

The invention claimed is:

1. A single photon source comprising a semiconductor body and a transducer, wherein
the semiconductor body has an active zone that generates individual photons, the active zone containing a piezoelectric semiconductor material,
the transducer is configured to generate surface waves,
the semiconductor body and the transducer are arranged with respect to one another such that the surface waves generated by the transducer during operation of the single photon source can be coupled into the active zone,
the active zone is disposed between a first semiconductor layer and a second semiconductor layer of the semiconductor body,
the active zone and the transducer are arranged at a same vertical height to a carrier of the single photon source and on an intermediate layer made of a piezoelectric material so that the intermediate layer is a propagation medium for the surface waves generated or excited by the transducer,
the intermediate layer is arranged in places between the first semiconductor layer and the active zone and adjoins the active zone, and
an electrical insulation between the intermediate layer and the transducer is achieved by the intermediate layer being undoped at least in overlapping regions with the transducer or by an insulating layer being arranged between the transducer and the intermediate layer.

2. The single photon source according to claim 1, wherein the semiconductor body has a first semiconductor layer, the active zone and the transducer being applied to the same first semiconductor layer and spaced apart from one another in the lateral direction.

3. The single photon source according to claim 1 comprising a carrier, wherein the active zone and the transducer are arranged at the same vertical height to the carrier.

4. The single photon source according to claim 1, wherein the intermediate layer is undoped and adjoins both the active zone and the transducer.

5. The single photon source according to claim 1, wherein the transducer is arranged on the semiconductor body and is electrically insulated therefrom.

6. The single photon source according to claim 1, wherein an emission rate of the single photon sources is adjustable in kHz, MHz and GHz frequency ranges.

7. The single photon source according to claim 1,
wherein the second semiconductor layer and the active zone form an island-like subregion of the semiconductor body on the intermediate layer and on the first semiconductor layer,
the geometrical size of the active zone is selected such that, due to quantization and Coulomb repulsion, an energy splitting in the quantum well is greater than a thermal energy dependent on the operating temperature so that exactly one electron and one hole occupy one quantum well of the active zone per surface wave period, and
the active zone is based on InGaN and the intermediate layer is made of GaN.

8. The single photon source according to claim 1, wherein the transducer is an interdigital transducer (IDT) having finger-like structures that interlock without touching each other.

9. The single photon source according to claim 1, wherein the active zone is assigned to an island-like subregion of the semiconductor body.

10. The single photon source according to claim 1, wherein the semiconductor body comprises a first semiconductor layer and a second semiconductor layer,
the active zone is disposed between the first semiconductor layer and the second semiconductor layer,
the first semiconductor layer is contiguous, and
the active zone and the second semiconductor layer each comprise a plurality of laterally spaced apart portions forming island-like subregions of the semiconductor body.

11. The single photon source according to claim 1, further comprising first a contact point and a second contact point of the semiconductor body as well as a first connection point and a second connection point of the transducer, wherein the contact points are assigned to a first electric circuit during operation of the single photon source and the connection points are assigned to a second electric circuit different from the first electric circuit.

12. The single photon source according to claim 1, wherein the active zone is based on InGaN.

13. A method of producing a single photon source, comprising:
applying a semiconductor body onto a substrate, wherein the semiconductor body has a first semiconductor layer, a second semiconductor layer and an active zone that generates individual photons, the active zone containing a piezoelectric semiconductor material,
structuring the semiconductor body such that the second semiconductor layer and the active layer are removed in regions as a result of which the active layer has at least one island-like portion formed as an active zone assigned to an island-like subregion of the semiconductor body on the first semiconductor layer, and
forming a transducer on a surface of the semiconductor body exposed by structuring, wherein the transducer is configured to generate surface waves and is laterally spaced from the active zone, and the semiconductor body and the transducer are arranged with respect to one another such that the surface waves generated by the transducer during operation of the single photon source can be coupled into the active zone.

14. The method according to claim 13, further comprising removing surrounding regions of the island-like subregion of the semiconductor body along the vertical direction throughout the second semiconductor layer and the active layer up to a slightly doped or undoped intermediate layer of the semiconductor body, and forming the transducer on the exposed surface of the intermediate layer.

15. The method according to claim 13, further comprising forming a passivation layer on the island-like subregion of the semiconductor body, opening the passivation layer in places to expose the second semiconductor layer, and applying a radiation-permeable contact layer onto the second semiconductor layer.

16. A method of generating photons, comprising:
providing the single photon source according to claim 1, electrically biasing the active zone of the semiconductor body of the single photon source by an external electrical voltage is selected such that a band deflection but no recombination of charge carriers takes place in the active zone, generating surface waves by the transducer of the single photon source, the semiconductor body and the transducer being arranged with respect to one another such that the surface waves generated by the transducer are coupled into the active zone as a result of which a piezoelectric voltage is generated in the active zone, and exciting a recombination of charge carriers in the active zone by superpositioning the external electric voltage and the piezoelectric voltage to generate the photons.

17. The method according to claim 16, in which the frequency of occurrence of the individual recombination of charge carriers is adjusted by the frequency of the electrical voltage applied to the transducer.

18. The method according to claim 16, wherein an emission rate of the single photon sources is adjustable in kHz, MHz and GHz frequency ranges.

19. A single photon source comprising a semiconductor body and a transducer, wherein the semiconductor body has an active zone that generates individual photons, the active zone containing a piezoelectric semiconductor material, the transducer is configured to generate surface waves, the semiconductor body and the transducer are arranged with respect to one another such that the surface waves generated by the transducer during operation of the single photon source can be coupled into the active zone, and the single photon source has one of:
   i. the active zone is assigned to an island-like subregion of the semiconductor body; or
   ii. the semiconductor body comprises a first semiconductor layer and a second semiconductor layer, the active zone is disposed between the first semiconductor layer and the second semiconductor layer, the first semiconductor layer is contiguous, and the active zone and the second semiconductor layer each comprise a plurality of laterally spaced apart portions forming island-like subregions of the semiconductor body.

* * * * *